United States Patent
Uchida (10) Patent No.: US 8,000,369 B2
(45) Date of Patent: Aug. 16, 2011

(54) SURFACE EMITTING LASER ARRAY, PRODUCTION PROCESS THEREOF, AND IMAGE FORMING APPARATUS HAVING SURFACE EMITTING LASER ARRAY

(75) Inventor: Tatsuro Uchida, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 6 days.

(21) Appl. No.: 12/696,302

(22) Filed: Jan. 29, 2010

(65) Prior Publication Data

US 2010/0129946 A1    May 27, 2010

Related U.S. Application Data

(62) Division of application No. 12/030,322, filed on Feb. 13, 2008, now Pat. No. 7,680,168.

(30) Foreign Application Priority Data

Feb. 28, 2007   (JP) .................................. 2007-048860

(51) Int. Cl.
*H01S 5/00* (2006.01)
(52) U.S. Cl. .............. 372/50.124; 372/43.01; 372/45.01
(58) Field of Classification Search ............... 372/43.01, 372/45.01, 50.124
See application file for complete search history.

(56) References Cited

U.S. PATENT DOCUMENTS

| | | | |
|---|---|---|---|
| 5,986,996 A * | 11/1999 | Kitamura et al. | 369/112.16 |
| 7,245,646 B2 | 7/2007 | Kaneko | 372/50.1 |
| 7,295,745 B2 | 11/2007 | Uchida | 385/129 |
| 2007/0201527 A1 | 8/2007 | Hori et al. | 372/50.124 |
| 2008/0031297 A1 | 2/2008 | Uchida | 372/45.01 |

FOREIGN PATENT DOCUMENTS

| | | |
|---|---|---|
| JP | 11-340570 | 12/1999 |
| JP | 2003-086895 | 3/2003 |
| JP | 2005-209717 | 8/2005 |

* cited by examiner

*Primary Examiner* — Dung Nguyen
(74) *Attorney, Agent, or Firm* — Fitzpatrick, Cella, Harper & Scinto (57) ABSTRACT

A surface emitting laser array comprising a plurality of surface emitting laser devices each having a semiconductor layer containing a first reflection mirror, an active layer, a current confined portion and a second reflection mirror. The laser array further comprises a first metal material layer for dissipating heat formed through a first insulating layer on the semiconductor layer and a second metal material layer for injecting current into the active layer formed through a second insulating layer on the first metal material layer. The first metal material layer is commonly shared by the plurality of the surface emitting laser devices.

2 Claims, 5 Drawing Sheets

SURFACE EMITTING LASER ARRAY, PRODUCTION PROCESS THEREOF, AND IMAGE FORMING APPARATUS HAVING SURFACE EMITTING LASER ARRAY

CROSS REFERENCE TO RELATED APPLICATION

The present application is a division of U.S. application Ser. No. 12/030,322 filed on Feb. 13, 2008 the entire disclosure of which is incorporated by reference herein.

BACKGROUND OF THE INVENTION

1. Field of the Invention

The present invention relates to a surface emitting laser array, a production process thereof, and an image forming apparatus having a surface emitting laser array.

2. Description of the Related Art

A vertical cavity surface emitting laser (VCSEL) is a laser capable of emitting light in a direction perpendicular to a substrate surface and has a feature that a two-dimensional array can be easily formed, which an edge-emitting type laser does not have.

In particular, densification and faster operation can be simultaneously achieved by the parallel processing of multiple beams emitted from the two-dimensional array, and so it is expected to be used in various industrial applications. For example, when a vertical cavity surface emitting laser array is used as a light source for exposure of electrophotography, high-definition and faster printing can be achieved by parallel processing in a printing process by utilizing multiple beams.

On the other hand, the vertical cavity surface emitting laser involves a problem that saturation of light output is caused by temperature rise caused by generation of heat upon low-current driving compared with the edge-emitting type laser, and so the light output is limited.

In addition, the vertical cavity surface emitting laser also involves a problem that light output is lowered with rise of a peripheral temperature (environmental temperature) of a device.

In order to solve such problems, Japanese Patent Application Laid-Open No. 2003-086895 has proposed a vertical cavity type semiconductor light-emitting device in which a peripheral part of a mesa structure is charged with a plated metal to dissipate heat as well as to impart a function as an electrode.

When an array type vertical cavity surface emitting laser is applied to a light source for electrophotography, the distance between vertical cavity surface emitting laser devices is more and more shortened from demands such as faster operation and high definition, and there is a demand for more narrowing the pitch between the devices.

When peripheral parts of a mesa structure of such a narrow-pitch laser are charged with a plated metal like Japanese Patent Application Laid-Open No. 2003-086895, thereby forming plated structures which take a radiator function as a heat sink part, the plated structures come into contact with each other, so that the devices are difficult to be independently driven.

On the other hand, in order to independently drive the devices, it is also considered that a plating-formation-inhibiting portion is formed as a device-isolating structure between the narrow-pitch devices. When such a device-isolating structure is formed, however, it is difficult to allow the area of the plated structure having the radiator function to be large.

As described above, it is difficult to achieve both independent drive of the respective devices and efficient heat dissipation when the distance between the devices is narrow in the prior art.

SUMMARY OF THE INVENTION

In view of the above-described problems, it is thus an object of the present invention to provide a surface emitting laser array that can efficiently perform heat dissipation and independently drive the devices even when the distance between the devices is narrow, and a production process of the array. Another object of the present invention is to provide an image forming apparatus using the laser array according to the present invention.

The present invention provides a surface emitting laser array comprising a plurality of surface emitting laser devices each having a semiconductor layer containing a first reflection mirror, an active layer, a current confined portion and a second reflection mirror, which further comprises a first metal material layer for dissipating heat formed through a first insulating layer on the semiconductor layer and a second metal material layer for injecting current into the active layer formed through a second insulating layer on the first metal material layer, wherein the first metal material layer is commonly shared by the plurality of the surface emitting laser devices.

The present invention also provides an image forming apparatus comprising the surface emitting laser array.

The present invention further provides a process for producing a surface emitting laser array comprising a semiconductor layer having a first reflection mirror, an active layer, a current confined portion and a second reflection mirror, the process comprising the steps of: etching the semiconductor layer to form a mesa structure; forming a first insulating layer on the semiconductor layer; forming a first metal material layer for dissipating heat on the first insulating layer so as to cover side regions of the active layer; forming a second insulating layer on the first metal material layer; and forming a second metal material layer for injecting current into the active layer on the second insulating layer.

According to the present invention, it is possible to realize a surface emitting laser array that can efficiently perform heat dissipation and independently drive the devices even when the distance between the devices is narrow. The production process of the surface emitting laser array according to the present invention can also be realized. The image forming apparatus having the surface emitting laser array according to the present invention can further be realized.

Further features of the present invention will become apparent from the following description of exemplary embodiments with reference to the attached drawings.

DESCRIPTION OF THE EMBODIMENTS

In an embodiment of the present invention, surface emitting laser devices each having a semiconductor layer containing a first reflection mirror, an active layer, a current confined portion and a second reflection mirror are used to constitute a vertical cavity surface emitting laser array in the following manner.

Upon the constitution of the vertical cavity surface emitting laser array in this embodiment, a first metal material layer for dissipating heat and a second metal material layer for injecting current into the active layer are respectively individually provided for efficiently dissipating heat generated and enabling independent drive.

Specifically, the first metal material layer is comprised of a metal material layer for heat dissipation and is so arranged as to cover a part of a mesa structure (particularly, so as to surround an active layer region) through a first insulating layer on the semiconductor layer.

The second metal material layer is comprised of a metal material layer for wiring, and a second insulating layer is inserted between the metal material layer for heat dissipation and the metal material layer for wiring so that these material layers are not electrically connected to each other.

The metal material layer for heat dissipation, which functions as a radiator, is commonly shared by the respective devices.

By the above-described constitution, the respective devices can be independently driven without being electrically connected to each other and heat can be efficiently dissipated even when the vertical cavity surface emitting laser array is narrow in pitch. In particular, there is no need to individually form a metal material layer for heat dissipation at every device like the prior art, and the metal material layer for heat dissipation, which functions as a radiator, can be commonly shared by the respective devices, so that the metal material layer can be formed as a heat sink having a large area to more efficiently conduct heat dissipation.

An image forming apparatus having the vertical cavity surface emitting laser array having the effect of the present invention is constituted, whereby an image forming apparatus capable of realizing high-speed and high-definition printing can be obtained.

The present invention will hereinafter be described by the following Examples.

EXAMPLE 1

In Example 1, a structural example of a vertical cavity surface emitting laser array constituted by applying the present invention is described.

Figure 1:
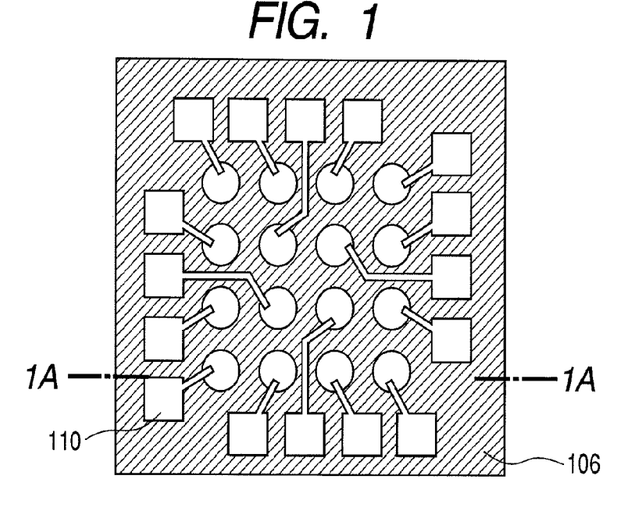
FIGS. 1 and 1A schematically illustrate a vertical cavity surface emitting laser array in Example 1 of the present invention.
Figure 1A:
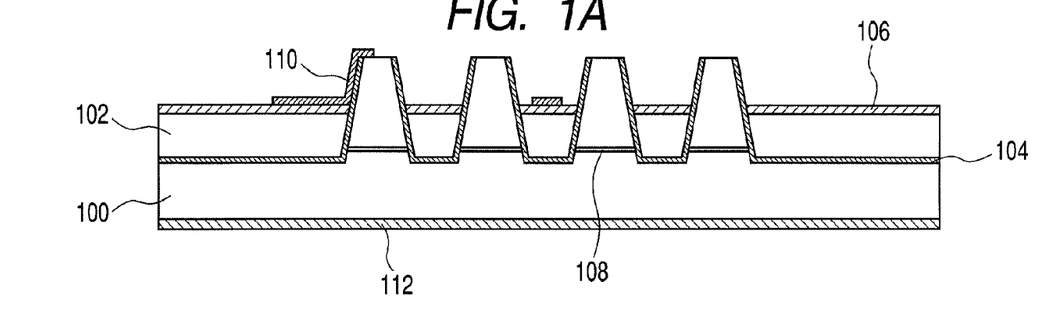

FIGS. 1 and 1A illustrate a vertical cavity surface emitting laser array according to this embodiment. FIG. 1A is a cross-sectional view taken along line 1A-1A in FIG. 1. A plurality of surface emitting laser devices is arranged in this surface emitting laser array.

In FIGS. 1 and 1A, a semiconductor layer 100 contains at least a first reflection mirror, an active layer, a current confined portion and a second reflection mirror, which are formed on a substrate.

In this embodiment, the first reflection mirror is comprised of a DBR mirror. In this embodiment, a first metal material layer is comprised of a metal material layer for heat dissipation indicated by '102'.

The laser array comprises a first insulating layer 104, a second insulating layer 106, the active layer 108, a metal material layer 110 for wiring and an electrode 112.

In the vertical cavity surface emitting laser array according to this embodiment, the first insulating layer 104 is formed on the semiconductor layer 100 at portions other than the top surface of a mesa structure which is so formed that the DBR mirror layer is exposed. In other words, the first insulating layer 104 is formed on the semiconductor layer except on laser emission ports formed on the upper layer side of the second reflection mirror.

The metal material layer 102 for heat dissipation is formed over the semiconductor layer 100, on which the first insulating layer 104 is formed, so as to cover them including side portions of the active layer 108.

The second insulating layer 106 is formed on at least other portions of the metal material layer for heat dissipation than the upper surface of the mesa structure.

The metal material layer 110 for wiring is formed on the second insulating layer 106.

According to such construction of this embodiment, the metal material layer 102 for heat dissipation and the metal material layer 110 for wiring can be formed being isolated by the insulating layer, so that the devices can be independently driven.

Since the metal material layer for heat dissipation can be commonly shared by the devices, heat can be more efficiently dissipated than the case where a metal portion for heat dissipation is formed at every device like the prior art. When the thickness of each metal material layer for heat dissipation is controlled to such a thickness that a wiring by the metal material layer for wiring is not broken by a level difference, the disconnection of the wiring can be inhibited.

The production process of the vertical cavity surface emitting laser array according to this embodiment will hereinafter be described.

FIGS. 2A to 2G are typical drawings illustrating the production process of the surface emitting laser array according to this embodiment.

In FIGS. 2A to 2G, an n-type GaAs substrate 200, a semiconductor epi layer 202, an active layer 204, a mesa structure 206, a first insulating layer 208, a metal material layer 210 for heat dissipation, a second insulating layer 212, a metal material layer 214 for wiring and an electrode metal layer 216 are illustrated.

In this embodiment, the vertical cavity surface emitting laser array is produced through the following respective steps.

Figure 2A:
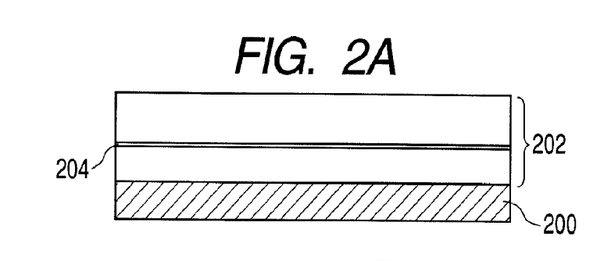
FIGS. 2A, 2B, 2C, 2D, 2E, 2F and 2G schematically illustrate a production process of the vertical cavity surface emitting laser array in Example 1 of the present invention.

First, as illustrated in FIG. 2A, the semiconductor epi layer 202 is grown on the n-type GaAs substrate 200 through a buffer layer in the following manner by an MOCVD system. More specifically, an n-type $Al_{0.9}Ga_{0.1}As/Al_{0.12}Ga_{0.88}As$-DBR mirror layer, an n-type $Al_{0.6}Ga_{0.4}As$ spacer layer, and a $GaAs/Al_{0.3}Ga_{0.7}As$-MQW active layer 204 are successively grown. Further, a p-type $Al_{0.6}Ga_{0.4}As$ spacer layer, a p-type $Al_{0.98}Ga_{0.02}As$ layer, a p-type $Al_{0.9}Ga_{0.1}As/Al_{0.12}Ga_{0.88}As$-DBR mirror layer and a p-type GaAs contact layer are then successively grown.

Figure 2B:
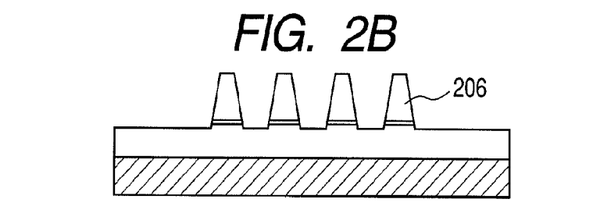

As illustrated in FIG. 2B, the mesa structure 206 is then formed by means of lithographic and dry etching techniques so as to expose the n-type $Al_{0.9}Ga_{0.1}As/Al_{0.12}Ga_{0.88}As$-DBR mirror layer. Incidentally, it is also applicable to only conduct etching to the $GaAs/Al_{0.3}Ga_{0.7}As$-MQW active layer 204 from the viewpoint of device isolation.

Figure 2C:
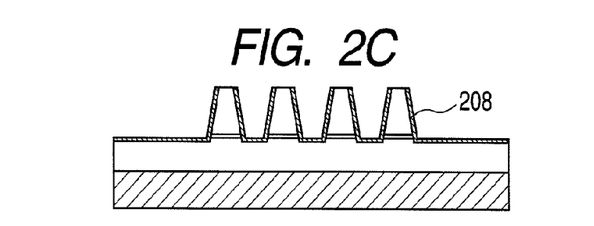

As illustrated in FIG. 2C, a first insulating layer (silicon oxide film) 208 is then formed at other portions than the top surface of the mesa structure by means of CVD film-forming, lithographic and etching techniques.

Figure 2D:
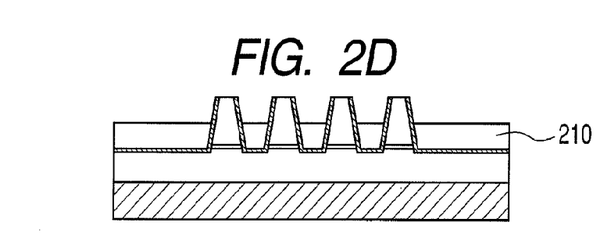

As illustrated in FIG. 2D, a metal material (Ti/Au) layer 210 for heat dissipation is then formed to a thickness of 3 μm on the first insulating layer by means of lithographic and metal deposition techniques so as to cover side regions of the active layer 204.

Figure 2E:
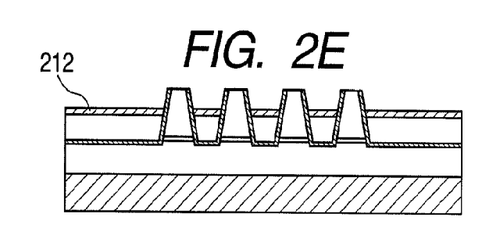

As illustrated in FIG. 2E, a second insulating layer 212 is then formed on at least other portions of the metal material layer for heat dissipation than the upper surface of the mesa structure by means of CVD film-forming, lithographic and etching techniques.

Figure 2F:
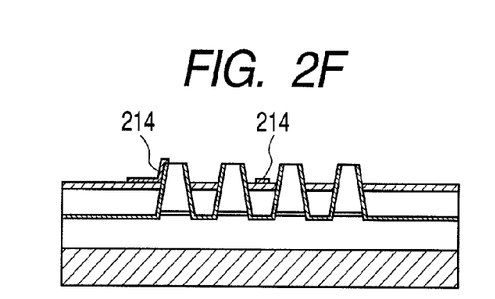

As illustrated in FIG. 2F, a metal material (Ti/Au) layer 214 for wiring for device-driving is then formed to a thickness of 1 μm on the second insulating layer by means of lithographic and metal deposition techniques.

Figure 2G:
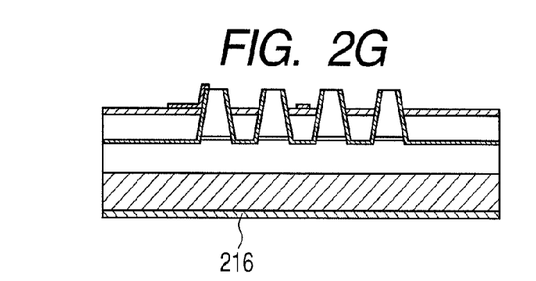

As illustrated in FIG. 2G, an electrode metal (AuGe/Au) layer 216 is then formed on the n-type GaAs substrate 200 by means of a metal deposition technique.

By the steps described above, the vertical cavity surface emitting laser array in which the metal material layer for efficiently dissipating heat generated in the active layer of the surface emitting laser and the metal material layer that is wiring for driving the surface emitting laser are individually formed can be obtained.

Incidentally, a 4×4 vertical cavity surface emitting laser array having a mesa diameter of 20 μm and a mesa pitch of 40 μm is formed in this embodiment. In this embodiment, the metal material layer for heat dissipation having a thickness of 2.5 μm from the center of the active layer is formed by deposition.

The thickness of the metal material layer for heat dissipation is controlled in such a manner that a height from the top of the mesa structure to the outermost surface of the metal material layer for heat dissipation is 2 μm or less. By taking such construction, the metal material layer for wiring can be formed without disconnection. Incidentally, if the height from the top of the mesa structure to the outermost surface of the metal material layer for heat dissipation exceeds 2 μm, the frequency of disconnection becomes high.

In an m×n (m and n: natural numbers exclusive of 0) vertical cavity surface emitting laser array having a pitch of 80 μm or less between surface emitting laser devices according to this construction, the following advantage can be obtained. More specifically, the metal material layers for heat dissipation and for wiring are isolated from each other (a layered structure is taken with an insulating layer inserted between these layers), whereby the degree of freedom of wiring pattern can be increased. In addition, a narrow-pitch, two-dimensional vertical cavity surface emitting laser array that can inhibit disconnection and efficiently dissipate heat generated in the active layer can be produced.

Although the 850-nm band vertical cavity surface emitting laser has been described in this embodiment, the present invention is not limited to this laser and may be applied to vertical cavity surface emitting lasers of, for example, a 680-nm band (GaInP/AlGaInP active layer system).

The techniques (systems) used in the growth, lithography, etching, asking and deposition in this embodiment are not limited to the above-described techniques (systems), and any other techniques (systems) may be used so far as like effects can be achieved.

EXAMPLE 2

In Example 2, a structural example of a vertical cavity surface emitting laser array according to another embodiment than the array of Example 1 constituted by applying the present invention is described. A difference of Example 2 from Example 1 resides in that the second insulating layer is formed only in regions in contact with the metal material layer for wiring.

Figure 3:
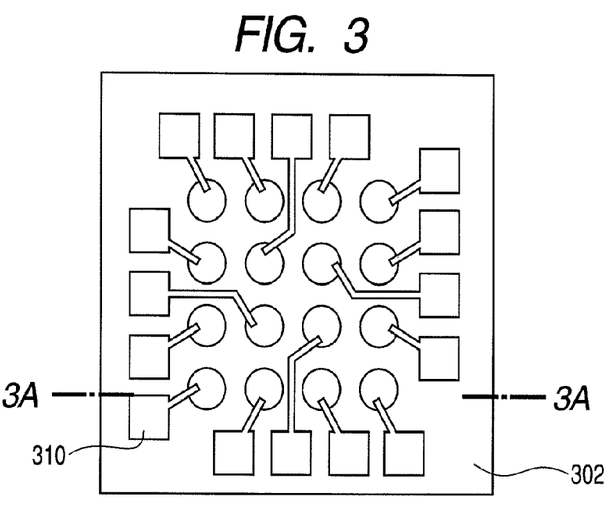
FIGS. 3 and 3A schematically illustrate a vertical cavity surface emitting laser array in Example 2 of the present invention.
Figure 3A:
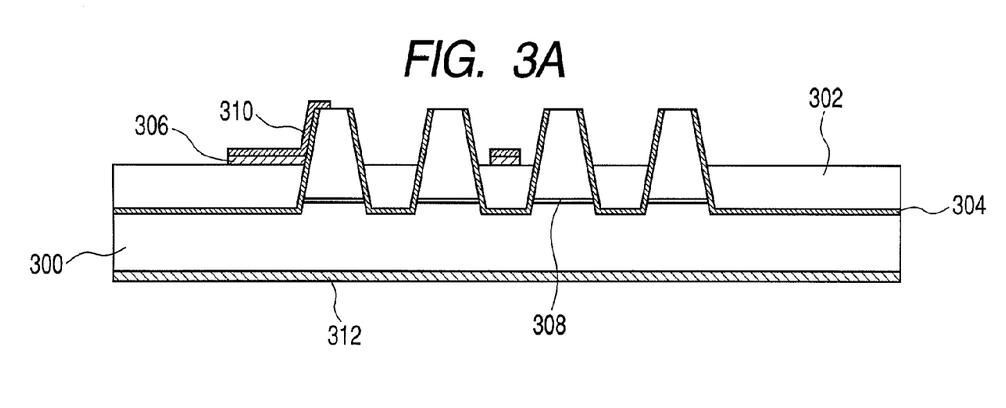

FIGS. 3 and 3A illustrate the vertical cavity surface emitting laser array according to this embodiment. FIG. 3A is a cross-sectional view taken along line 3A-3A in FIG. 3.

In FIGS. 3 and 3A, a semiconductor layer 300, a metal material layer 302, a first insulating layer 304, second insulating layer 306, an active layer 308, a metal material layer 310 for wiring and an electrode 312 are illustrated.

In the vertical cavity surface emitting laser array according to this embodiment, the first insulating layer 304 is formed on the semiconductor layer 100 and portions other than the top surface of mesa structure which is so formed that the DBR mirror layer is exposed.

The metal material layer 302 for heat dissipation is formed over the semiconductor layer 300, on which the first insulating layer 304 is formed, so as to cover them including side portions of the active layer 308. The second insulating layer 306 is formed only in regions in contact with the metal material layer 310 for wiring on the metal material layer 302 for heat dissipation.

The production process of the vertical cavity surface emitting laser array according to this embodiment will hereinafter be described.

FIGS. 4A to 4G are typical drawings illustrating the production process of the surface emitting laser array according to this embodiment.

In FIGS. 4A to 4G, an n-type GaAs substrate 400, a semiconductor epi layer 402, an active layer 404, a mesa structure 406, a first insulating layer 408, a metal material layer 410 for heat dissipation, a second insulating layer 412, a metal material layer 414 for wiring and an electrode metal layer 216 are illustrated.

In this embodiment, the vertical cavity surface emitting laser array is produced through the following steps.

Figure 4A:
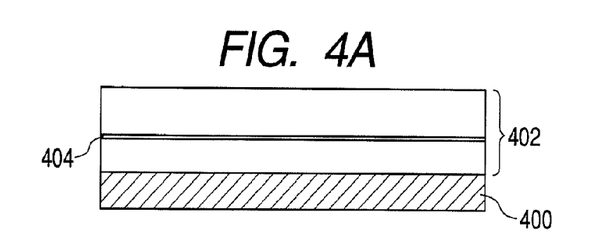
FIGS. 4A, 4B, 4C, 4D, 4E, 4F and 4G schematically illustrate a production process of the vertical cavity surface emitting laser array in Example 2 of the present invention.

First, as illustrated in FIG. 4A, the semiconductor epi layer 402 is grown on the n-type GaAs substrate 400 through a buffer layer in the following manner by an MOCVD system. More specifically, an n-type $Al_{0.9}Ga_{0.1}As/Al_{0.12}Ga_{0.88}As$-DBR mirror layer, an n-type $Al_{0.6}Ga_{0.4}As$ spacer layer, and a $GaAs/Al_{0.3}Ga_{0.7}As$-MQW active layer 404 are successively grown. Further, a p-type $Al_{0.6}Ga_{0.4}As$ spacer layer, a p-type $Al_{0.98}Ga_{0.02}As$ layer, a p-type $Al_{0.9}Ga_{0.1}As/Al_{0.12}Ga_{0.88}As$-DBR mirror layer and a p-type GaAs contact layer are then successively grown.

Figure 4B:
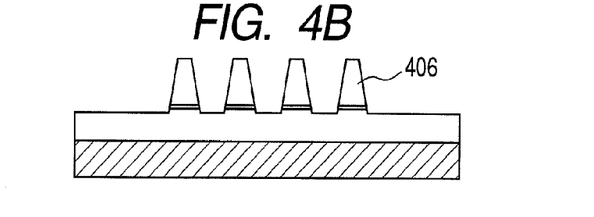

As illustrated in FIG. 4B, the mesa structure 406 is then formed by means of lithographic and dry etching techniques so as to expose the n-type $Al_{0.9}Ga_{0.1}As/Al_{0.12}Ga_{0.88}As$-DBR mirror layer.

Figure 4C:
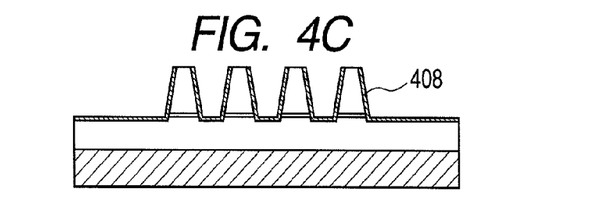

As illustrated in FIG. 4C, a first insulating layer (silicon oxide film) 408 is then formed at portions other than the top surface of the mesa structure by means of CVD film-forming, lithographic and etching techniques.

Figure 4D:
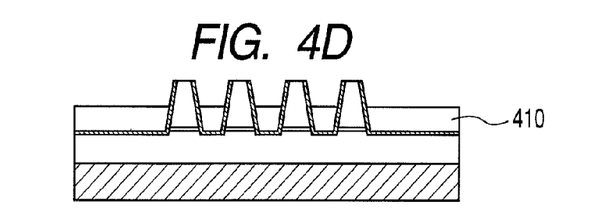

As illustrated in FIG. 4D, a metal material (Ti/Au) layer 410 for heat dissipation is then formed to a thickness of 3 μm by means of lithographic and metal deposition techniques so as to cover side regions of the active layer 404.

Figure 4E:
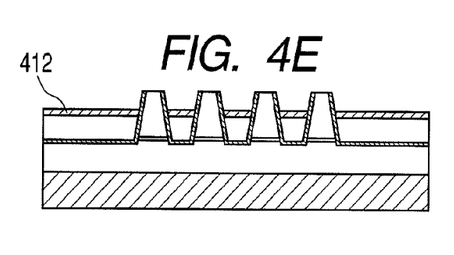

As illustrated in FIG. 4E, a second insulating layer 412 is then formed on portions other than the upper surface of the mesa structures by means of CVD film-forming, lithographic and etching techniques.

Figure 4F:
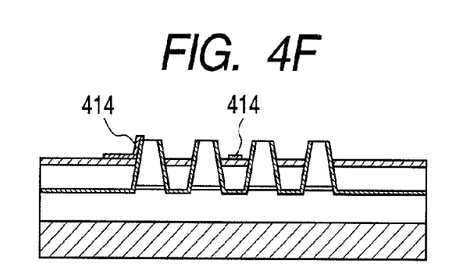

As illustrated in FIG. 4F, a metal material (Ti/Au) layer 414 for wiring for device-driving is then formed to a thickness of 1 μm on the second insulating layer by means of lithographic and metal deposition techniques.

Thereafter, the substrate is dipped in a buffered hydrofluoric acid, whereby the second insulating layer is etched by using the metal material layers 414 as a mask. In other words, regions of the second insulating layer which are not in contact with the second metal material layers are removed by the etching according to this process.

Figure 4G:
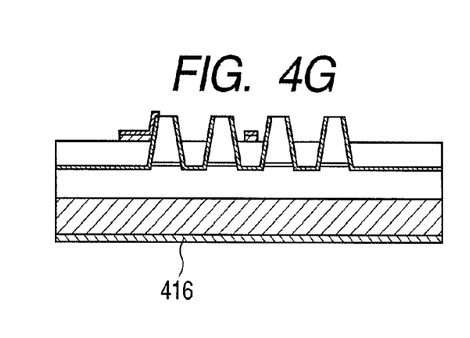

As illustrated in FIG. 4G, an electrode metal (AuGe/Au) layer 416 is then formed on the n-type GaAs substrate 400 by means of a metal deposition technique.

By the steps described above, the vertical cavity surface emitting laser array in which the metal material layer for efficiently dissipating heat generated in the active layers of the surface emitting laser devices and the metal material layer that is wiring for driving the surface emitting laser device are individually formed can be obtained.

In particular, the second insulating layer is formed only in the regions in contact with the metal material layer for wiring in this embodiment, whereby regions of the metal for heat dissipation covered with the insulating layer with low thermal conductivity can be minimized, and so heat can be more efficiently dissipated.

Incidentally, a 4×4 vertical cavity surface emitting laser array having a mesa diameter of 20 μm and a mesa pitch of 40 μm is formed in this embodiment. In this embodiment, the metal material layer for heat dissipation having a thickness of 2.5 μm from the center of the active layer is formed by deposition.

The thickness of the metal material layer for heat dissipation is controlled in such a manner that the height from the top of the mesa structure to the outermost surface of the metal material layer for heat dissipation is 2 μm or less. By taking such construction, the metal material layer for wiring can be formed without disconnection. Incidentally, if the height from the top of the mesa structure to the outermost surface of the metal material layer for heat dissipation exceeds 2 μm, the frequency of disconnection becomes high.

In an m×n (m and n: natural numbers exclusive of 0) vertical cavity surface emitting laser array having a pitch of 80 μm or less between surface emitting laser devices according to this construction, the following advantage can be obtained. More specifically, the metal material layers for heat dissipation and for wiring are isolated from each other (a layered structure is taken with an insulating layer inserted between these layers), whereby the degree of freedom of wiring pattern can be increased. In addition, a narrow-pitch, two-dimensional vertical cavity surface emitting laser array that can inhibit disconnection and efficiently dissipate heat generated in active layers can be produced.

Although the 850-nm band vertical cavity surface emitting laser has been described in this embodiment, the present invention is not limited to this laser and may be applied to vertical cavity surface emitting lasers of, for example, a 680-nm band (GaInP/AlGaInP active layer system).

The techniques (systems) used in the growth, lithography, etching, asking and deposition in this embodiment are not limited to the described techniques (systems), and any other techniques (systems) may be used so far as like effects can be achieved.

EXAMPLE 3

In Example 3, a structural example of an image forming apparatus having the vertical cavity surface emitting laser array according to the present invention is described.

Figure 5A:
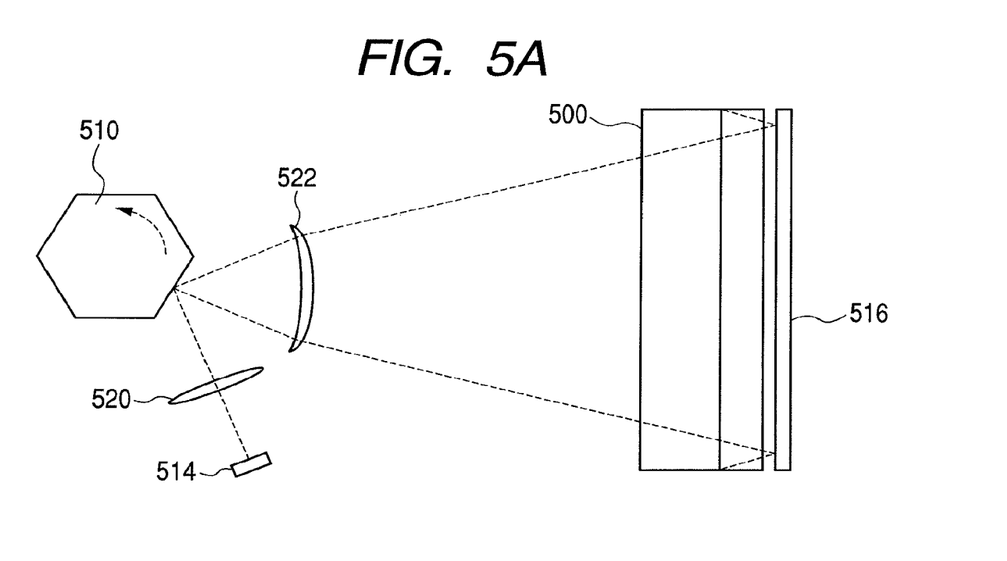
FIGS. 5A and 5B schematically illustrate structural drawings of an image forming apparatus of an electrophotographically recording system, in which a vertical cavity surface emitting laser array in Example 3 of the present invention is mounted.
Figure 5B:
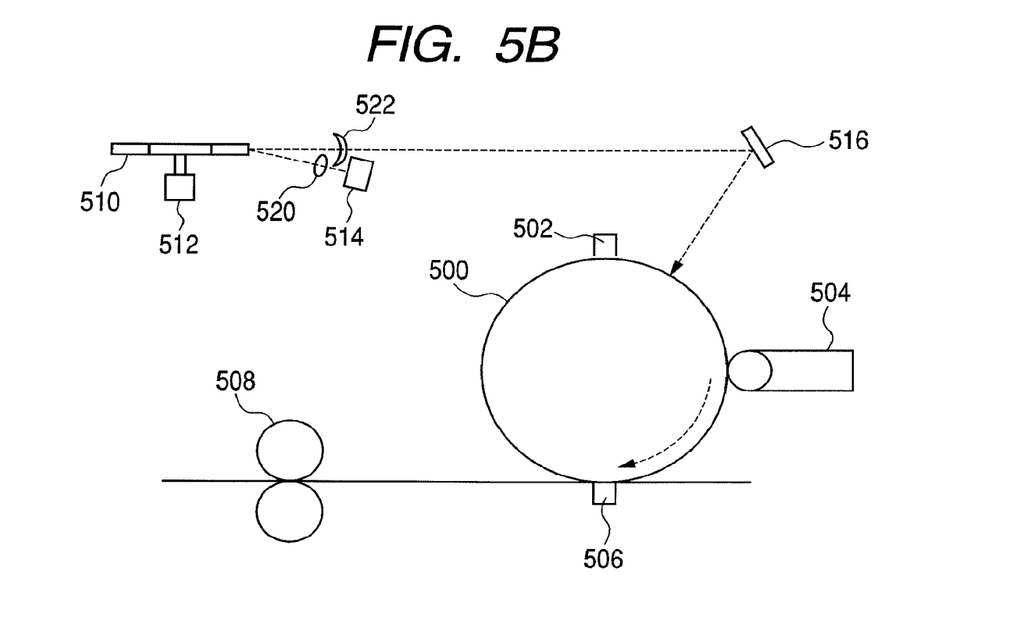

FIGS. 5A and 5B illustrate structural drawings of an image forming apparatus of an electrophotographically recording system, in which the vertical cavity surface emitting laser array according to the present invention is mounted. FIG. 5A is a side elevation of the image forming apparatus, and FIG. 5B is a side elevation of the apparatus.

In FIGS. 5A and 5B, a photosensitive drum 500, a charger 502, a developer 504, a transfer charger 506, a fixer 508, a polygon mirror 510, a motor 512, the vertical cavity surface emitting laser array 514, a reflection mirror 516, a collimator lens 520 and an f-θ lens 522 are illustrated.

In FIGS. 5A and 5B, the motor 512 rotationally drives the polygon mirror 510. The polygon mirror 510 in this embodiment has six reflection surfaces. The vertical cavity surface emitting laser array 514 serves as a light source for recording. The vertical cavity surface emitting laser array 514 is turned on or off by a laser driver (not illustrated) according to image signals.

Laser beams optically modulated in this manner are emitted toward the polygon mirror 510 through the collimator lens 520 from the vertical cavity surface emitting laser array 514. The polygon mirror 510 is rotated in the direction of the arrow, and the laser beams outputted from the vertical cavity surface emitting laser array 514 are reflected to be deflected beams continuously varying the outgoing angle on the reflection surfaces of the polygon mirror 510 with the rotation of the polygon mirror 510.

The reflected beams are subjected to compensation for distortion by the f-θ lens 522, exposed to the photosensitive drum 500 through the reflection mirror 516 and scanned in a main scanning direction.

At this time, an image of plural lines corresponding to the vertical cavity surface emitting laser array 514 is formed on the photosensitive drum 500 in the main scanning direction by the reflection of the laser beams on one surface of the polygon mirror 510. A 4×8 vertical cavity surface emitting laser array 514 is used in this embodiment, and so an image of 4 lines is formed.

The photosensitive drum 500 is charged in advance by the charger 502 and is subjected to successive exposure by the scanning of the laser beams to form an electrostatic latent image. The photosensitive drum 500 is rotated in the direction of the arrow, the electrostatic latent image formed is developed by the developer 504, and a visible image developed is transferred to transfer paper (not illustrated) by the transfer charger 506.

The transfer paper, to which the visible image has been transferred, is conveyed to the fixer 508 and discharged out of the apparatus after the fixing.

Incidentally, a beam detection sensor (not illustrated; hereinafter referred to as "BD sensor") is arranged in the vicinity of a scan-starting position in the main scanning direction in a side portion of the photosensitive drum 500. The laser beams reflected on the respective reflection surfaces of the polygon mirror 510 are detected by the BD sensor prior to the line scanning. The detected signals are inputted as scan-starting reference signals into a timing controller (not illustrated), and write-starting positions of scanning directions of the respective lines are synchronized based on these signals.

Incidentally, the 4×8 vertical cavity surface emitting laser array is used in this embodiment. However, the present invention is not limited to this laser array, and an m×n (m and n: natural numbers exclusive of 0) vertical cavity surface emitting laser array may also be used.

As has been described above, the vertical cavity surface emitting laser array according to the present invention is used in the image forming apparatus of the electrophotographically recording system, whereby an image forming apparatus capable of performing high-speed and high-definition printing can be obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-048860, filed Feb. 28, 2007, which is hereby incorporated by reference herein in its entirety.

What is claimed is:

1. A process for producing a surface emitting laser array that includes a semiconductor layer having a first reflection mirror, an active layer, a current confined portion, and a second reflection minor, the process comprising:

etching the semiconductor layer to form a mesa structure;
    forming a first insulating layer on the semiconductor layer;
    forming a first metal material layer, for dissipating heat, on the first insulating layer so as to cover side regions of the active layer,
        wherein a height of a lower edge of the first metal material layer is positioned below a height of the active layer, and
        wherein a height of an upper edge of the first metal material layer is positioned above the height of the active layer;
    forming a second insulating layer on the first metal material layer; and
    forming a second metal material layer, for injecting current into the active layer, on the second insulating layer.

2. The production process according to claim 1, further comprising removing regions of the second insulating layer that are not in contact with the second metal material layer by etching after the second metal material layer is formed on the second insulating layer.

* * * * *